United States Patent [19]

Fujita et al.

[11] Patent Number: 4,865,655
[45] Date of Patent: Sep. 12, 1989

[54] GALLIUM ARSENIDE PHOSPHIDE MIXED CRYSTAL EPITAXIAL WAFER WITH A GRADED BUFFER LAYER

[75] Inventors: Hisanori Fujita, Ushiku; Masaaki Kanayama, Tsuchiura; Takeshi Okano, Ushiku, all of Japan

[73] Assignees: Mitsubishi Monsanto Chemical Co., Ltd.; Mitsubishi Chemical Industries, Ltd., both of Tokyo, Japan

[21] Appl. No.: 122,591

[22] Filed: Nov. 18, 1987

Related U.S. Application Data

[63] Continuation of Ser. No. 874,548, Jun. 16, 1986, abandoned.

[30] Foreign Application Priority Data

Jun. 19, 1985 [JP] Japan ................................ 60-133554

[51] Int. Cl.$^4$ ...................... H01L 33/00; H01L 21/20
[52] U.S. Cl. ..................................... 148/33; 148/33.4; 148/DIG. 41; 148/DIG. 56; 148/DIG. 67; 148/DIG. 72; 148/DIG. 97; 156/610; 357/17; 437/126; 437/127; 437/128; 437/133; 437/905; 437/169
[58] Field of Search .................. 148/DIG. 22, 41, 42, 148/56, 57, 67, 65, 72, 97, 99, 110, 169, 33, 33.4; 156/610-614; 357/17, 16, 60, 88; 437/23, 104, 107, 81, 110, 112, 126, 127, 128, 133, 905, 946, 949, 969, 971

[56] References Cited

U.S. PATENT DOCUMENTS

| | | | |
|---|---|---|---|
| 3,867,202 | 2/1975 | Ichiki et al. | 148/175 |
| 3,963,538 | 6/1976 | Broadie et al. | 148/175 |
| 3,963,539 | 6/1976 | Kemlage et al. | 148/175 |
| 4,252,576 | 2/1981 | Hasegawa et al. | 148/33.4 |
| 4,378,259 | 3/1983 | Hasegawa et al. | 148/175 |
| 4,438,446 | 3/1984 | Tsang | 357/17 |
| 4,495,514 | 1/1985 | Lawrence et al. | 357/67 |
| 4,510,515 | 4/1985 | Kajita et al. | 357/17 |
| 4,561,915 | 12/1985 | Mito | 148/171 |
| 4,616,241 | 10/1986 | Biefeld et al. | 357/16 |

FOREIGN PATENT DOCUMENTS

2819781 11/1978 Fed. Rep. of Germany .
2231926 6/1981 Fed. Rep. of Germany .
205284 12/1983 German Democratic Rep. .

OTHER PUBLICATIONS

DE-Z: Siemens Forschungs-u. Entwicklungs-berichte, 3, 1974, pp. 55-60 (Huber et al.).

*Primary Examiner*—Brian E. Hearn
*Assistant Examiner*—William D. Bunch
*Attorney, Agent, or Firm*—Burgess, Ryan & Wayne

[57] ABSTRACT

An epitaxial wafer for producing arrays of GaAsP-LEDs comprises, in the GaAs$_{1-x}$P$_x$ layer with varying X, a layer region(s) with a discontinuous variance of x along the thickness of the GaAs$_{1-x}$P$_x$ layer. This layer region(s) contribute to a uniformity in the brightness of the light emission of LEDs formed in the epitaxial wafer.

7 Claims, No Drawings

GALLIUM ARSENIDE PHOSPHIDE MIXED CRYSTAL EPITAXIAL WAFER WITH A GRADED BUFFER LAYER

This application is a continuation, of application Ser. No. 874,548, filed June 16, 1986 now abandoned.

BACKGROUND OF THE INVENTION

1. Field of the Invention

The present invention relates to a gallium arsenide phosphide-, mixed crystal-epitaxial wafer which is appropriate for the production of an array of light-emitting diodes having improved uniformity in the brightness thereof.

2. Description of the Related Arts

In a printer system in which electrostatic latent images are produced by means of optically image-forming characters or figures on a photosensitive layer consisting of electrostatic photosensitive material, a toner is applied on the photosensitive layer, and the electrostatic latent images are then copied on the paper or the like. This kind of system features low noise and a high speed and is used as a printer for a computer or word processor. Hereinafter, this printer system will be referred to as an electrostatic printer.

Conventionally, a gas laser, such as helium-neon laser, or a semiconductor laser, is used as the light source of an electrostatic printer. The former light source is disadvantage by its large size, and although the latter light source is small in size it nevertheless has a drawback. Namely a semiconductor laser of continuous oscillation type practically used at present exhibits an oscillation wavelength of 780 nm or longer. On the other hand, the photosensitive materials, such as cadmium sulfide (CdS), and selenium (Se), exhibit a highest sensitivity in a short wavelength region of 700 nm or shorter. The oscillation wavelength of semiconductor laser do not, therefore, match the wavelength at which the highest sensitivity of the photosensitive materials is exhibited. Consequently a high efficiency is not obtained.

In addition to the above drawback, the semiconductor laser is not easily produced because of a complicated structure, exhibits a short life, and is expensive (Bulletin for Electron Photograph Society Vol. 23, No. 2, pp 47-55 (1984)).

Light emitting diodes have recently attracted attention, since, the emission wavelength thereof can be freely selected from the infrared region to a visible region, and thus the matching between the emission wavelength and the wavelength at which the photosensitive materials exhibit the highest sensitivity can be easily attained. In addition, the life of light emitting diodes is long, and their structure is simple and compact.

When the laser is used as a light source, since it has a satisfactory brightness, one laser or several lasers are scanned over the electrostatic photosensitive layer to generate latent images. The brightness of a light emitting diode is generally lower than that of a semiconductor lazer and, therefore, an array of light emitting diodes is constituted for providing the light source of an electrostatic printer. In this array, for example, from sixteen to thirty two light emitting diodes per mm are aligned in one row having a length of several millimeters, and a number of such rows are arranged along the photosensitive layer, so as to form arrays of light emitting diodes. The discrete light emitting diodes which constitutes the arrays are controlled independently from one another, so as to form latent images.

For producing the arrays of light emitting diodes (hereinafter referred to as "LED arrays"), not the so called film hybrid structure, in which requisite numbers of discrete light emitting diodes are mounted on a ceramic substrate and are electrically connected with each other, is employed, but the monolithic structure, in which the requisite number of minute light emitting diodes are formed on one substrate of single crystalline gallium arsenide, gallium phosphide, or the like, is generally employed. This is because, the light emitting diodes can be highly integrated in the monolithic structure, and this facilitates the size reduction of a light source and provides an excellent mass productivity.

Gallium arsenide phosphide ($GaAs_{1-x}P_x$, $0 < X < 1$), mixed crystal-epitaxial wafer, which is appropriate for the emission of light having a wavelength of from 700 to 600 nm, at which the electrostatic photosensitive material exhibits the highest sensitivity, is used as the semiconductor material for producing the LED arrays used for an electrostatic printer. The gallium arsenide phosphide ($GaAs_{1-x}P_x$, $0 < X < 1$) is hereinafter referred to as the GaAsP, and "x" is hereinafter referred to as the mixed crystal ratio.

The conventional GaAsP epitaxial wafer has the following structure. As the single crystalline substrate, single crystalline gallium arsenide (GaAs) or gallium phosphide (GaP) is generally used. A graded layer is formed on the single crystalline substrate. In this layer, the mixed crystal ratio continuously changes from $x=0$ (i.e., GaAs) or $x=1$ (i.e., GaP) to a predetermined value ($x_1$) of a constant layer which is formed on the graded layer. The continuous change of the mixed crystal ratio from $x=0$ or $x=1$ to $X_1$ is intended to prevent the generation of crystal defects, such as dislocation and the like, due to differences in the lattice constant between the substrate and the constant layer. On the graded layer, the constant layer is formed.

The mixed crystal ratio of this layer is determined, when an LED is produced using the GaAsP epitaxial layer, so as to obtain the light emission of a desired wavelength. A pn junction is formed in the constant layer when producing an LED, and the obtained LED emits the light having a wavelength corresponding to the band gap of this layer.

When the LED arrays are used as the light source of an electrostatic printer, the brightness of each LED included in the LED arrays is required to be within $+20\%$ of the average brightness value of the total number of LEDs contained in the LED arrays, since otherwise the brightness distribution results in a distribution of the printed image density. When the LED arrays are produced by using conventional GaAsP epitaxial wafers, a brightness distribution within $+20\%$ is obtained at a very low yield of the LED arrays.

SUMMARY OF THE INVENTION

It is an object of the present invention to provide a GaAsP wafer which enhances the yield of LED arrays having a small distribution of brightness such that they can be used as the light source of an electrostatic printer.

In accordance with the objects of the present invention, there is provided a GaAsP mixed crystal epitaxial wafer, which consists of a single crystalline substrate, a GaAsP layer formed on the substrate and having a varying mixed crystal ratio (hereinafter referred to as the "graded layer"), and a GaAsP layer formed on the graded layer and having a constant mixed crystal ratio (hereinafter referred to as the "constant layer"), characterized in that the epitaxial wafer comprises at least one layer, in which the mixed crystal ratio discontinuously varies, on or in the graded layer.

The single crystalline substrate is a base on which the graded and constant GaAsP layers are grown. The single crystalline substrate determines the crystallographic plane orientation of the graded and constant GaAsP layers which are grown on the substrate as a single crystal. The materials of the single crystalline substrate are not limited but are preferably those having a small difference in the lattice constant between the same and the constant layer. The single crystalline substrate may be sliced from a single crystal of silicon, germanium, or sapphire, but is preferably sliced from a single crystal of GaAs or GaP, because the difference in the lattice constant between the same and the constant GaAsP layer becomes small. The single crystalline substrate is cut from a single crystal of GaAs or the like in the form of a rod, i.e., an ingot, by means of a slicing machine. The crystallographic orientation of the substrate surface is preferably {100} plane on an inclined plane from the {100} plane by $0.5° \sim 10°$, in the case of using a GaAs or GaP single crystal, because an excellent epitaxial layer is thus obtained. The surface of the sliced single crystal substrate is mechanically and/or chemically polished to remove any damage caused during slicing and to mirror-finish the surface. The single crystalline substrate is usually from 0.1 to 0.5 mm thick.

According to the present invention, is formed at least one layer of a region, in which the mixed crystal ratio discontinuously varies, in the graded layer. The region in which the mixed crystal ratio discontinuously varies herein defines a region where the mixed crystal ratio varies by $5 \times 10^{-3} \sim 5 \times 10^{-2}$, preferably $2 \times 10^{-2} \sim 4 \times 10^{-2}$, per 1 $\mu$m thickness of the graded layer. If the variance of the mixed crystal ratio is less than $5 \times 10^{-3}$, the effects according to the present invention are not attained. On the other hand, if the mixed crystal ratio variance exceeds $5 \times 10^{-2}$, the brightness of the LEDs is disadvantageously lessened. At least one such region needs to be formed in the graded layer. Preferably, layers of such region do not exceed three.

The region in which the mixed crystal ratio discontinuously varies may be formed within the graded layer or at an interface between the single crystalline substrate and the graded or constant layer.

The thickness of a graded layer is dependent upon the difference in lattice constants between the single crystalline substrate and the constant layer but is usually from 5 to 200 $\mu$m, preferably from 20 to 100 $\mu$m.

The variance in the mixed crystal ratio along the thickness is measured by an X-ray microanalyzer on the cross section of an epitaxial wafer.

As is described hereinabove, the wavelength of the light emitted by LEDs is determined by the mixed crystal ratio of the constant layer. This mixed crystal ratio is selected in accordance with the requisite wavelength of the light emitted by LED, preferably so as to attain a matching between the peak wavelength of the LEDs and the wavelength at which the electrostatic photosensitive material exhibits the highest sensitivity. Usually, the mixed crystal ratio is in the range of from 0.35 to 0.45. GaAsP having the mixed crystal ratio of 0.4, i.e., $GaAs_{0.6}P_{0.4}$, exhibits a peak light emission wavelength of approximately 660 nm. This matches virtually the wavelength at which cadmium sulfide exhibits the highest sensitivity. $GaAs_{0.6}P_{0.4}$ is therefore preferred when the cadmium sulfide is used as the electrostatic photosensitive material. The thickness of a constant layer is usually from 10 to 200 $\mu$m, more preferably from 20 to 150 $\mu$m.

The constant and graded GaAsP layers may have either a p or an n conductivity, usually an n type. The carrier concentration in these layers is preferably from $1 \times 10^{16}$ to $1 \times 10^{18}$ cm$^{-3}$. An impurity used to impart the n type conductivity is preferably sulfur or tellurium.

The constant and graded layers are preferably formed not by the liquid-phase epitaxial growth method but by the vapor-phase epitaxial growth method, since the mixed crystal ratio can be then easily adjusted. The gases used for the vapor-phase epitaxial growth are: Ga-HCl-AsH$_3$-PH$_3$-H$_2$ series (reaction between HCl and Ga occurs at 700° ~ 900° C. to yield gaseous Ga(Cl); Ga(CH$_3$)$_3$-AsH$_3$-PH$_3$-H$_2$ series; or, Ga(C$_2$H$_5$)$_3$-AsH$_3$-PH$_3$-H$_2$ (c.f., "Electronics Gijutsu Zenshu (6) Light Emitting Diode" edited and written by Shoji Aoki, Kogyo Chosakai, 1977, pp 113–117). The mixed crystal ratio is adjusted by adjusting the composition of the gases for the vapor-phase epitaxial growth. For example, when the Ga-HCl-AsH$_3$-PH$_3$-H$_2$ series-gases are used, the feed rates of AsH$_3$ and PH$_3$ are adjusted to adjust the mixed crystal ratio with regard to its variance of the graded layer, and also its discontinuous variance by an amount of $5 \times 10^{-3}$ to $5 \times 10^{-2}$ per $\mu$m.

The LED arrays are produced by an ordinary method, e.g., by forming a resist film having a configuration corresponding to an array pattern, diffusing an impurity, such as Zn, selectively with the aid of the resist film, to form a pn junction, and subsequently forming electrodes on both the diffused surface and back side surface.

The present invention is hereinafter described by way of an example and a comparative example.

EXAMPLE

A single crystalline GaAs substrate having a round shape with a diameter of 50 mm and a thickness of 350 $\mu$m, was used as the single crystalline substrate. The surface of this substrate was mirror finished and had an orientation of 2.0° inclined from the (00$\bar{1}$) plane to the <$\bar{1}$10> direction. The single crystalline GaAs substrate was doped with silicon and $17 \times 10^{17}$ cm$^{-3}$ of the n type carrier concentration.

The single crystalline substrate described above was placed in a horizontal type epitaxial reactor made of quartz and having an inner diameter of 70 mm and a length of 1000 mm. Metallic gallium was contained in a boat made of quartz and the boat was placed in the reactor.

Argon gas was introduced into the reactor to replace the air with argon. After the replacement, the feeding of the argon gas was stopped and high purity-hydrogen gas was introduced into the reactor at a flow rate of 2500 ml/minute while the reactor temperature was raised.

When the placed portions of the Ga-containing quartz boat and the substrate arrived at 830° C. and 750° C., these temperatures were maintained, and hydrogen chloride gas was fed for 2 minutes into the reactor at a flow rate of 90 ml/minute from a portion of the reactor downstream of the gallium-containing quartz boat, thereby etching the surface of a single crystalline GaAs substrate.

After stopping the feeding of the hydrogen chloride gas, a hydrogen gas, which contained 10 ppm by volume of diethyltellurium, was fed into the reactor at a flow rate of 10 ml/minute. Subsequently, a hydrogen chloride gas was blown into the reactor at a flow rate of 18 ml/minute so as to bring this gas into contact with the surface of gallium contained in the boat. Arsine (AsH3) and phosphine (PH3) were fed, subsequently, by the following method, so as to form a graded layer. That is, a hydrogen gas containing 10% by volume of arsine was fed into the reactor at a flow rate of 336 ml/minute, which flow rate was gradually decreased to 252 ml/minute for a period of 60 minutes. At the same time as the feeding of the arsine-containing hydrogen gas, a hydrogen gas containing 10% by volume of phosphine was fed at a flow rate of 6 ml/minute, which flow rate was gradually increased to 80 ml/minute for a period of 60 minutes.

When 60 minutes had lapsed at the time of initiating the formation of a graded layer, then a constant GaAsP layer was formed for a period of 60 minutes by maintaining the flow rate of the arsine-containing hydrogen gas to 252 ml/minute, the flow rate of the phosphine-containing hydrogen gas to 80 ml/minute, and the flow rate of the diethyl-tellurium-containing hydrogen gas to 10 ml/minute. The temperature of the reactor was caused to fall to complete the production of an epitaxial wafer. The following layers were formed in the thus obtained epitaxial wafer. A 19 $\mu$m thick graded layer in which the mixed crystal ratio "x" varied continuously from 0.03 to 0.4, was formed on the single crystalline GaAs substrate. On this graded layer, a $GaAs_{0.6}P_{0.4}$ layer (a constant GaAsP layer having the constant mixed crystal ratio of $X=0.4$) was formed. This $GaAs_{0.6}P_{0.4}$ layer was 22 $\mu$m thick and had an n type carrier concentration of $8.0 \times 10^{16}$ cm$^{-3}$. Verification was made by an X-ray microanalyzer that, in a portion of the mixed cystal ratio-varying GaAsP layer in contact with the substrate, the mixed crystal ratio varied discontinuously from 0 to 0.03 per $\mu$m of thickness.

Using the epitaxial wafer produced as described above, 4 mm long LED arrays were produced by a selective diffusion method. One LED had a square shape 40 $\mu$m long on one side. Sixteen LEDs were arranged per one mm of the LED arrays. All of the LEDs were arranged in one row. The average peak wavelength of the LED arrays was 660 nm.

The yield of LED arrays, in which the distribution of brightness of the LEDs was within ±20% of the average brightness thereof, was 63%.

Comparative Example

An epitaxial wafer was produced by the same method as in the Example, except that during growth of a graded layer, the flow rate of phosphine was gradually increased from 0 ml/minute to 80 ml/minute for a period of 60 minutes.

In the epitaxial wafer thus-produced, the following layers were formed. A 22 $\mu$m thick graded layer was formed on the GaAs substrate. On this layer, a 21 $\mu$m thick $GaAs_{0.6}P_{0.4}$ layer (constant layer) was formed. The n type carrier-concentration of the graded and constant GaAsP layers was $8.2 \times 10^{16}$ cm$^{-3}$.

Using the epitaxial wafer produced as described above, 4 mm long LED arrays were produced by a selective diffusion method. One LED had a square shape 40 $\mu$m long on one side. Sixteen LEDs were arranged per one mm of the LED arrays. All of the LEDs were arranged in one row. The average peak wavelength of the LED arrays was 661 nm.

The yield of LED arrays, in which the distribution of brightness of the LEDs was within ±20% of the average brightness thereof, was 13%.

As is apparent from Example and Comparative Example, the epitaxial wafer according to the present invention greatly enhances the yield of LED arrays capable of being used as the light source of an electrostatic printer as compared with the case of using a conventional epitaxial wafer.

We claim:

1. An epitaxial wafer of gallium arsenide phosphide mixed crystal, having an improved brightness distribution, consisting of a single crystalline substrate, a gallium arsenide phosphide layer formed on the single crystal substrate having a thickness of 5–22 microns and having a mixed crystal ratio varying along a thickness thereof (hereinafter referred to as the graded layer), and a gallium arsenide phosphide layer formed on the graded layer and having a constant mixed crystal ratio along a thickness thereof (hereinafter referred to as the constant layer), wherein said epitaxial wafer comprises, in said graded layer, at least one layer region, in which the mixed crystal ratio of gallium arsenide phosphide discontinuously varies along the thickness thereof, in the range of from $2 \times 10^{-2}$ to $5 \times 10^{-2}$ per micron of thickness and wherein said graded layer was formed by incorporating phosphorus into said graded layer at a rate greater than 1% per micron of said graded layer.

2. An epitaxial wafer according to claim 1, wherein the single crystalline substrate consists of gallium arsenide.

3. An epitaxial wafer according to claim 1, wherein the single crystalline substrate consists of gallium phosphide.

4. An epitaxial wafer according to claim 1 or 2, wherein the mixed crystal ratio of the constant layer is one value in the range of from 0.35 to 0.45.

5. An epitaxial wafer according to claim 4, wherein said one value is 0.4.

6. An epitaxial wafer according to claim 4, wherein said graded layer has a thickness in the range of from 5 to 200 $\mu$m.

7. An epitaxial wafer according to claim 4 or 6, wherein said graded layer comprises said at least one layer region on an interface between the same and the single crystalline substrate or the constant layer, in which at least one layer region the mixed crystal ratio varies discontinuously with respect to the variance of the mixed crystal ratio of said graded layer.

* * * * *